(12) United States Patent
Eggum et al.

(10) Patent No.: US 12,140,860 B2
(45) Date of Patent: Nov. 12, 2024

(54) RETICLE POD WITH WINDOW

(71) Applicant: ENTEGRIS, INC., Billerica, MA (US)

(72) Inventors: Shawn D. Eggum, Lonsdale, MN (US); Anthony M. Tieben, Belle Plaine, MN (US); Brian Wiseman, Glencoe, MN (US); Russ V. Raschke, Chanhassen, MN (US); Huaping Wang, Eden Prairie, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/066,358

(22) Filed: Oct. 8, 2020

(65) Prior Publication Data
US 2021/0109439 A1   Apr. 15, 2021

Related U.S. Application Data
(60) Provisional application No. 62/913,518, filed on Oct. 10, 2019.

(51) Int. Cl.
| | | |
|---|---|---|
| G03F 1/66 | (2012.01) |
| B65D 85/48 | (2006.01) |
| H01L 21/673 | (2006.01) |

(52) U.S. Cl.
CPC .............. *G03F 1/66* (2013.01); *B65D 85/48* (2013.01); *H01L 21/67359* (2013.01); *H01L 21/67376* (2013.01); *H01L 21/67386* (2013.01)

(58) Field of Classification Search
CPC ........... G03F 1/66; B65D 85/48; B65D 25/54; B65D 75/522; H01L 21/67359; H01L 21/67376; H01L 21/67386; H01L 21/67253

USPC .............................. 206/316.1, 710, 701, 723
See application file for complete search history.

(56) References Cited

U.S. PATENT DOCUMENTS

| | | | |
|---|---|---|---|
| 3,905,708 A | 9/1975 | Steck, III | |
| 5,860,550 A * | 1/1999 | Miller | B65D 25/54 |
| | | | 220/4.23 |
| 6,193,459 B1 | 2/2001 | Rush | |
| 6,216,873 B1 | 4/2001 | Fosnight et al. | |
| 6,264,054 B1 * | 7/2001 | Miyake | B65D 81/2038 |
| | | | 220/23.91 |
| 6,948,619 B2 | 9/2005 | Su | |
| 7,236,233 B2 | 6/2007 | Heerens | |
| 7,737,416 B2 | 6/2010 | Gunji | |
| 7,850,032 B2 * | 12/2010 | Carnevali | B63B 49/00 |
| | | | 206/811 |
| 7,953,507 B2 | 5/2011 | Burda | |
| 7,975,848 B2 | 7/2011 | Lin | |

(Continued)

FOREIGN PATENT DOCUMENTS

| | | |
|---|---|---|
| CN | 213240796 U | 5/2021 |
| EP | 1434094 A1 | 6/2004 |

(Continued)

*Primary Examiner* — J. Gregory Pickett
*Assistant Examiner* — Jenine Pagan

(57) ABSTRACT

A door of a reticle pod includes a window having a lens, sidewall, and a ledge. The window may be positioned or affixed internally in a door between the housing and a cover. A compressive seal may be used in conjunction with the window. The sidewalls, the ledge and the compressive seal work together to enable a compression fit in the door while maintained the desired level of protection from external contaminants.

15 Claims, 9 Drawing Sheets

(56) References Cited

U.S. PATENT DOCUMENTS

| | | |
|---|---|---|
| 8,173,971 B2 | 5/2012 | Gunji |
| 8,220,630 B1 | 7/2012 | Ku |
| 8,591,163 B2 | 11/2013 | Toyoda |
| 9,022,216 B2 | 5/2015 | Ku |
| 9,155,367 B2 * | 10/2015 | Fathollahi ................ A45F 5/00 |
| 2003/0234208 A1 | 12/2003 | Huang |
| 2004/0011699 A1 * | 1/2004 | Park ................ H01L 23/49537 |
| | | 206/832 |
| 2005/0117142 A1 * | 6/2005 | Heerens ................ G03F 7/707 |
| | | 355/75 |
| 2005/0167492 A1 | 8/2005 | Hsueh |
| 2006/0052889 A1 | 3/2006 | Burda |
| 2006/0286606 A1 | 12/2006 | Oliver |
| 2007/0168318 A1 | 7/2007 | Burda |
| 2008/0203302 A1 | 8/2008 | Gunji |
| 2010/0230592 A1 | 9/2010 | Gunji |
| 2010/0243867 A1 | 9/2010 | Suzuki |
| 2011/0073469 A1 | 3/2011 | Ma |
| 2011/0188977 A1 | 8/2011 | Toyoda |
| 2012/0037522 A1 * | 2/2012 | Chiu ................ H01L 21/67359 |
| | | 206/316.1 |
| 2012/0175279 A1 | 7/2012 | Ku |
| 2013/0126378 A1 | 5/2013 | Ku |
| 2014/0070828 A1 | 3/2014 | Andberg |
| 2014/0116920 A1 | 5/2014 | Lee et al. |
| 2014/0178160 A1 | 6/2014 | Fosnight |
| 2014/0262847 A1 * | 9/2014 | Yang ................ F16M 13/022 |
| | | 206/37 |
| 2017/0031165 A1 * | 2/2017 | Costa ................ G02B 27/028 |
| 2017/0294326 A1 | 10/2017 | Raschke |
| 2018/0210349 A1 | 7/2018 | Hsueh |
| 2019/0009967 A1 * | 1/2019 | Lung ................ B65D 25/54 |
| 2019/0214287 A1 | 7/2019 | Chiu |

FOREIGN PATENT DOCUMENTS

| | | |
|---|---|---|
| JP | 40427949 A | 1/1992 |
| JP | 2007329439 A | 12/2007 |
| JP | 2009246154 A | 10/2009 |
| JP | 2011124591 A | 6/2011 |
| JP | 2015163967 A | 9/2015 |
| JP | 2016500844 A | 1/2016 |
| KR | 20040008457 A | 1/2004 |
| KR | 20050096606 A | 10/2005 |
| KR | 20070002730 A | 1/2007 |
| KR | 20070040983 A | 4/2007 |
| KR | 200474380 Y1 | 9/2014 |
| KR | 101571713 B1 | 11/2015 |
| KR | 20160150176 A | 12/2016 |
| WO | 2009114965 A1 | 9/2009 |
| WO | 2014040071 A1 | 3/2014 |
| WO | 2015066484 A1 | 5/2015 |
| WO | 2018111227 A1 | 6/2018 |
| WO | 2019018281 A1 | 1/2019 |
| WO | 2020088394 A | 5/2020 |

* cited by examiner

RETICLE POD WITH WINDOW

CROSS-REFERENCE TO RELATED APPLICATION

This application claims the benefit of and priority to U.S. Provisional Application No. 62/913,518 filed on Oct. 10, 2019, which is incorporated by reference herein in its entirety for all purposes.

TECHNICAL FIELD

This disclosure relates generally to a container for storage, transport, shipping and processing of reticles and pellicles used in photolithography processes for semiconductor manufacturing. More particularly, this disclosure relates to a reticle container including a window in a door of the container.

BACKGROUND

One of the process steps commonly encountered in the fabrication of integrated circuits and other semiconductor devices is photolithography. Broadly, photolithography involves selectively exposing a specially prepared wafer surface to a source of radiation using a patterned template to create an etched surface layer. Typically, the patterned template is a reticle, which is a very flat glass plate that contains the patterns to be reproduced on the wafer. For example, the wafer surface may be prepared by first depositing silicon nitride on it followed by a coating of a light-sensitive liquid polymer or photoresist. Next, ultraviolet (UV) light or extreme ultraviolet light (EUV) is shone through or reflected off a surface of a mask or reticle to project the desired pattern onto the photoresist-covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is then subjected to an etch process that removes the exposed portion of the nitride layer leaving a nitride pattern on the wafer in the exact design of the mask. This etched layer, singly or in combination with other similarly created layers, represent the devices and interconnects between devices characterizing the "circuitry" of an integrated circuit or semiconductor chip.

In certain practices, the storage and shipping reticles and pellicles requires engineered containers. Maintaining the integrity of the reticle or pellicle, during storage, transport, or shipping is a primary concern. The containers do not possess a means for inspection of the reticle or pellicle without opening the container and exposing the device to particles or other forms of contamination. The insertion of a window in the door so a sensor can read the demarcations or indicators on the reticle or pellicle inside the pod, allow viewing of the reticle or pellicle inside the pod, or both.

SUMMARY

This disclosure relates generally to a container for storage, transport, shipping and processing of reticles and pellicles used in photolithography processes for semiconductor manufacturing. More particularly, this disclosure relates to a reticle container including a window in a door of the container.

In one embodiment, the window of this disclosure possesses a lens, sidewalls, a ledge and a compressive seal. The window may be positioned or affixed internally in a door between the housing and a cover. The sidewalls, the ledge and the compressive seal work together to enable a compression fit in the door while maintained the desired level of protection from external contaminants.

In other embodiments, a reticle pod door includes: a door housing; a door cover secured to the door housing; an aperture defined in the door housing; and a window including a lens, a sidewall and a ledge, wherein the window is container within the reticle pod door between the door cover and the door housing such that the lens is viewable through the aperture defined in the door housing.

In still yet other embodiments, a reticle container includes a pod cover a pod door, wherein the pod door includes a door housing, a door cover secured to the door housing, an aperture defined in the door housing, and a window including a lens, a sidewall and a ledge, wherein the window is retained in the pod door such that the lens is viewable through the aperture defined in the door housing.

BRIEF DESCRIPTION OF THE DRAWINGS

The disclosure may be more completely understood in consideration of the following description of various illustrative embodiments in connection with the accompanying drawings

Figure 1:
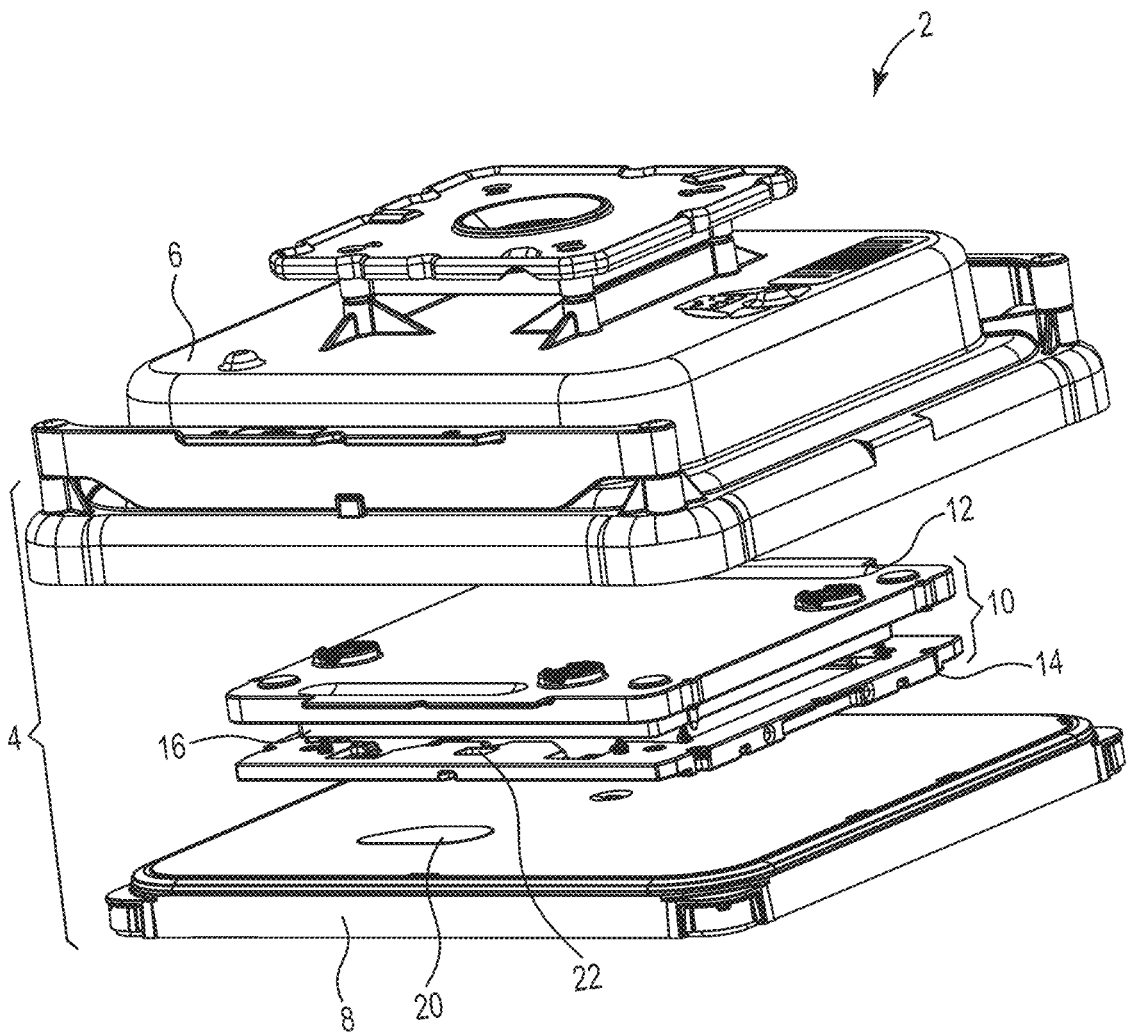
FIG. 1 is an exploded view of a reticle container in accordance with various embodiments of this disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

In certain embodiments, the window, as described herein according to various embodiments of the disclosure, has a one-piece construction with side walls to allow compression sealing between the door housing and the door cover without direct fastening by mechanical means. This may prevent at least the generation of particles from the fastening device. Additionally, the window, according to various embodiments, may be (i) a single lens to enhance light transmission and (ii) placed in close proximity to the indicia to enhance reading and detection of the fragile devices enclosed in the reticle pod.

FIG. 1 is an exploded view of an exemplary reticle container 2. In one illustrative embodiment, as shown, reticle container 2 is an Extreme Ultraviolet (EUV) reticle pod used to transport reticles through the various stages of an EUV photolithography process used in the manufacturing of semiconductors. As can be seen in FIG. 1, reticle container includes an outer pod 4 including an outer pod cover 6 and an outer pod door 8. An inner pod 10 is contained within outer pod 4 and includes an inner pod cover 12 configured to mate with an inner pod door 14. Contained within the environment of inner pod 10 is a reticle 16. According to various embodiments of this disclosure, outer pod door 8 includes window 20 which, when reticle container 2 is assembled, is aligned with window 22 provided in inner pod door 14, as is best viewed in FIG. 2. The alignment of window 20 provided in outer pod door 8 with window 22 of inner pod door 14 facilitates viewing of reticle 16 contained within inner pod 10 and/or permits a sensor to read the demarcations or indicators on the reticle or pellicle inside inner pod 10 without a need to open access the interior space of the outer pod 4 and/or inner pod 10.

Figure 3:
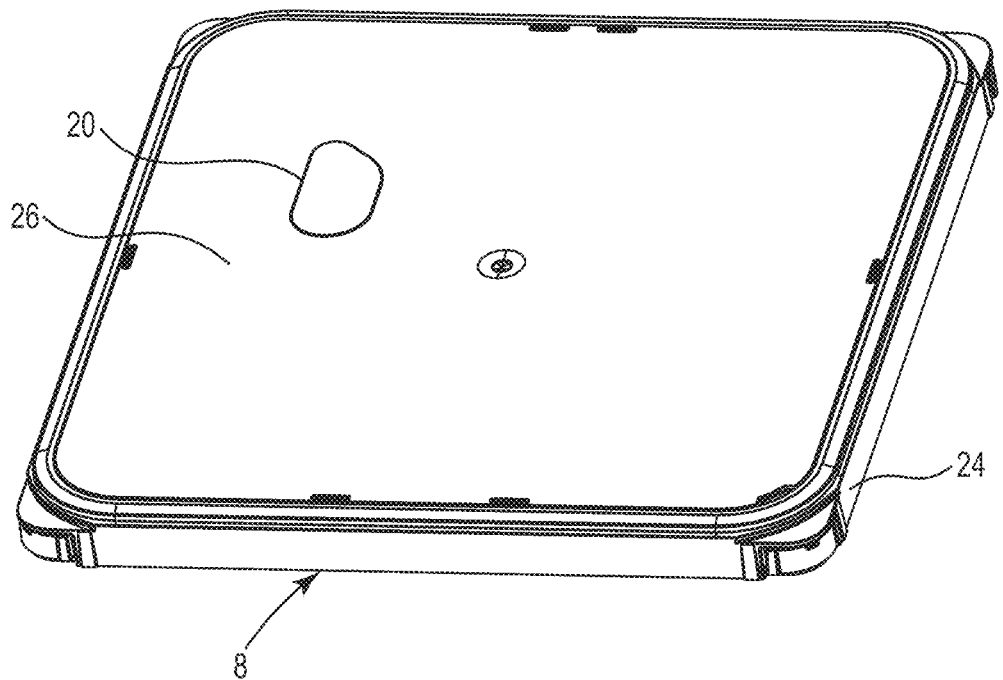
FIG. 3 depicts a window positioned within a door of a reticle container in accordance with embodiments of this disclosure.

FIG. 3 shows outer pod door 8 including window 20 in accordance with an embodiment of this disclosure. As shown in FIG. 3, window 20 is retained in outer pod door 8. Outer pod door 8 is constructed of outer pod door cover 24 and outer pod door housing 26. Window 20 is retained between door cover 24 and door housing 26. Those of ordinary skill in the art with knowledge of this disclosure will recognize that outer pod door 8 may possess other features or ancillary devices to support other functions and operations of the reticle pod and door 8. Non-limiting examples of other feature or ancillary devices may include seals, latches, reticle retaining posts, or more.

Figure 2:
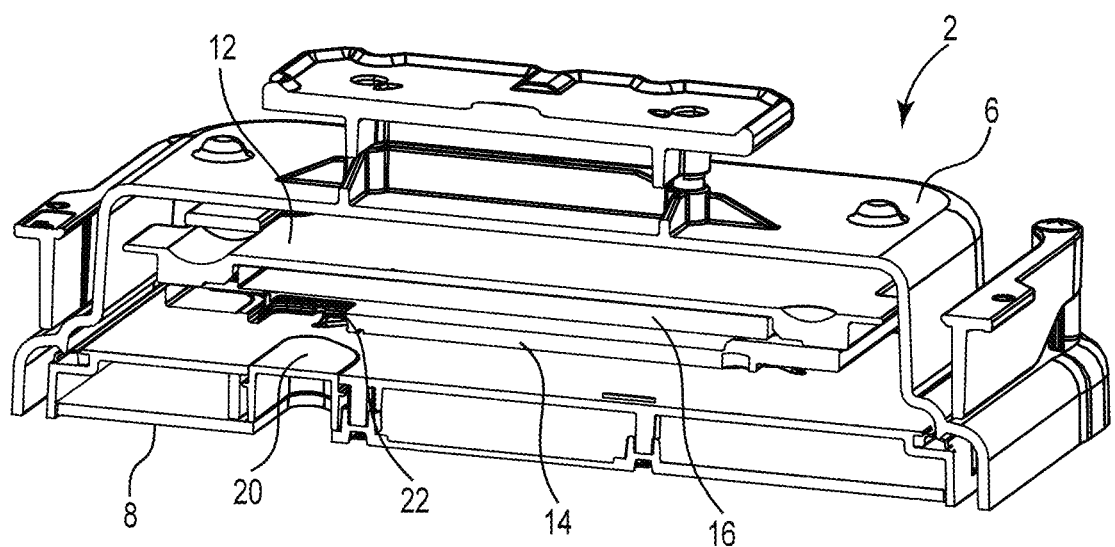
FIG. 2 is a cross-sectional view of a reticle container as shown in accordance with embodiments of the disclosure
Figure 4:
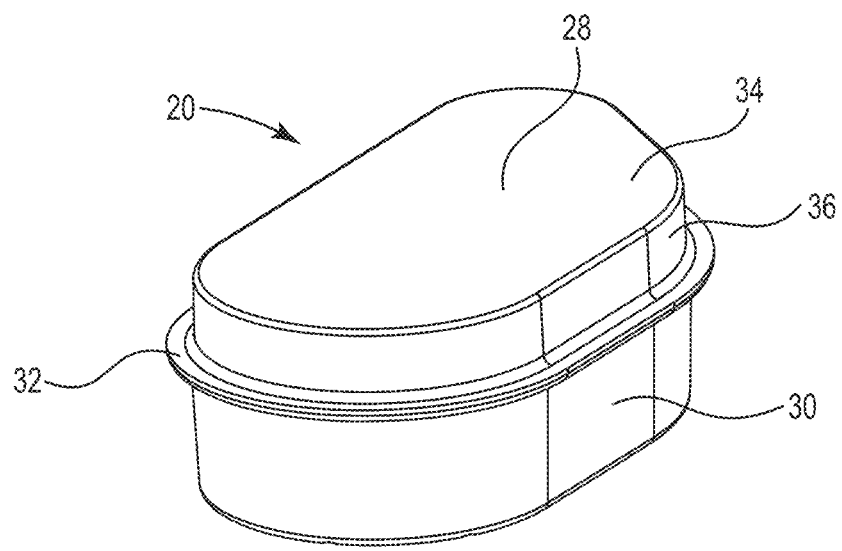
FIG. 4 illustrates an embodiment of a window for insertion into a door of a reticle container.

FIG. 4 shows an exemplary window 20 in accordance with an embodiment of this disclosure. Window 20 includes a lens 28, sidewall 30 and ledge 32. As shown in FIG. 2, lens 28, sidewall 30 and ledge 32 are provided as a single, integral piece. In some embodiments, lens 28 can have a flat upper surface 34. Sidewall 30 extends in a direction downward and away from lens 28 and circumscribes lens 28. Ledge 32 extends in a direction outward and away from sidewall 30 and also extends around an outer perimeter 36 of window 20 defined by sidewall 30.

Window 20 is constructed of a transparent material to permit the access to the indicia by the reading device. In certain embodiments, window 20 is constructed from a polycarbonate. Other clear polymers may be suitable for the fabrication of window 20. In addition, lens 28 preferably has a smooth surface to allow enough light to transmit through the lens for reading indicia. Window 20 including lens 28 can be formed by conventional melt processing techniques, such as injection molding.

Window 20 may be sufficiently sized and shaped to enable a reading device to read any indicia on a reticle (e.g., reticle 16 in FIGS. 1 and 2) contained within an inner pod such as, for example, inner pod 10 of a reticle container. For example, the reading device, through window 20 can read a two-dimensional bar code on a reticle or detect the pellicle frame on the reticle contained within the inner pod.

Figure 5:
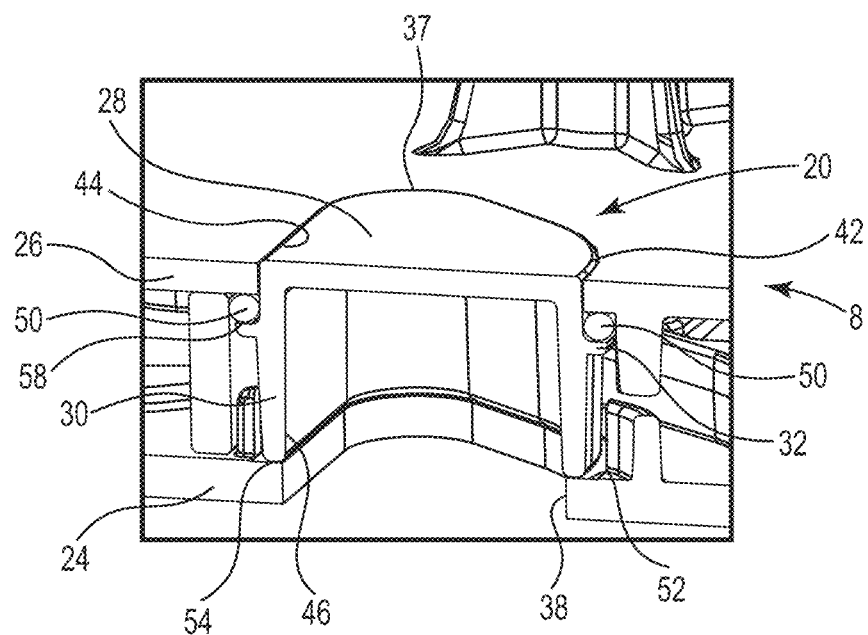
FIG. 5 is a partial cross-sectional view showing the window of FIG. 4 affixed within a door of a reticle container.

As shown in FIG. 5, window 20, having lens 28 and sidewall 30, can be retained by between door cover 24 and door housing 26 of an outer pod door such as, for example, outer pod door 8. In operation, window 20 is received in an aperture 37 of door housing 26. An outer periphery 42 of lens 28 matches the size and shape of an inner periphery 44 of aperture 37. In addition, door cover 24 has an aperture 38 that matches the size and shape of an inner periphery 46 of side wall 30.

In some embodiments, as shown in FIG. 5, a compressive seal such as, compressive seal 50, can be utilized to facilitate retention of window 20 within outer pod door 8 of the reticle container. As shown in the embodiment depicted in FIG. 5, compressive seal 50 is retained around an outer perimeter 36 of window 20 atop ledge 32. Compressive seal 50 can be formed from an elastomeric compound. In certain embodiments, compressive seal is formed from a fluoroelastomer. Fluoroelastomers are generally considered cleaner polymers and do not generate an abundance of particles in applications such as compression sealing. In some embodiments, compressive seal 50 can be an O-ring.

In some embodiments, window 20 is inserted into aperture 37 of housing 26 such an upper surface 52 of door cover 24 surrounding aperture 38 contacts a bottom edge 54 of sidewall 30 so as to compress compressive seal 50 between an inner surface 56 of door housing 26 and an upper surface 58 of ledge 32. Door cover 24 is secured to door housing 26 by conventional mechanical fasteners to maintain compression on the compressive seal 50 to retain window 20 in door 8. The compression is a sufficient force to minimize the transfer of both air or particulate matter past compressive seal 50 and into an enclosure of a reticle pod.

FIGS. 6-13 show additional embodiments of a window to be retained within a door of a reticle container.

Figure 6:
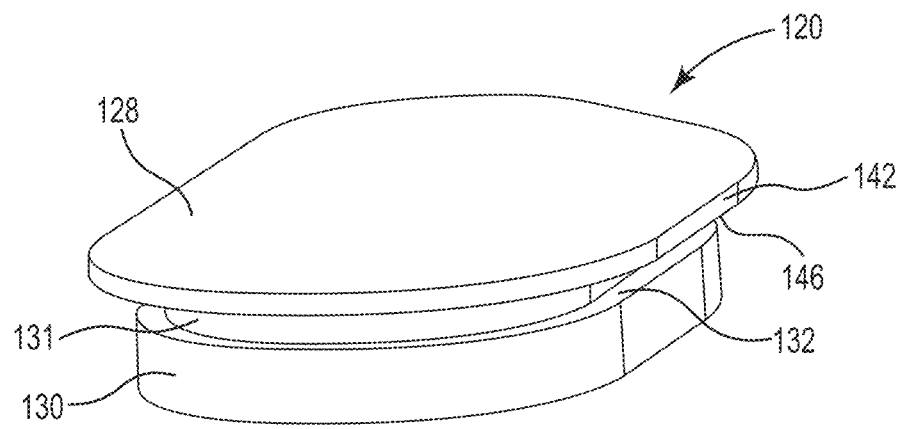
FIG. 6 illustrates another embodiment of a window for insertion into a door of a reticle container.

FIG. 6 shows an exemplary window 120 in accordance with another embodiment of this disclosure. Window 120 includes a lens 128 and sidewall 130. Sidewall 130 extends in a direction downward and away from lens 128 and circumscribes lens 128. A recess 131 in sidewall 130 defines a ledge 132. Lens 128 and sidewall 130 can be provided as a single, integral piece. Ledge 132 is defined by recess 131 formed in an outer perimeter 136 of sidewall 130. In some embodiments, lens 128 can have a flat upper surface 134.

Window 120 is constructed of a transparent material to permit the access to the indicia by the reading device. In certain embodiments, window 120 is constructed from a polycarbonate. Other clear polymers may be suitable for the fabrication of window 120. In addition, lens 128 preferably has a smooth surface to allow enough light to transmit through the lens for reading indicia. Window 120 including lens 128 can be formed by conventional melt processing techniques, such as injection molding.

Window 120 may be sufficiently sized and shaped to enable a reading device to read any indicia on a reticle (e.g., reticle 16 in FIGS. 1 and 2) contained within an inner pod such as, for example, inner pod 10 of a reticle container. For example, the reading device, through window 120 can read a two-dimensional bar code on a reticle or detect the pellicle frame on the reticle contained within the inner pod.

Figure 7:
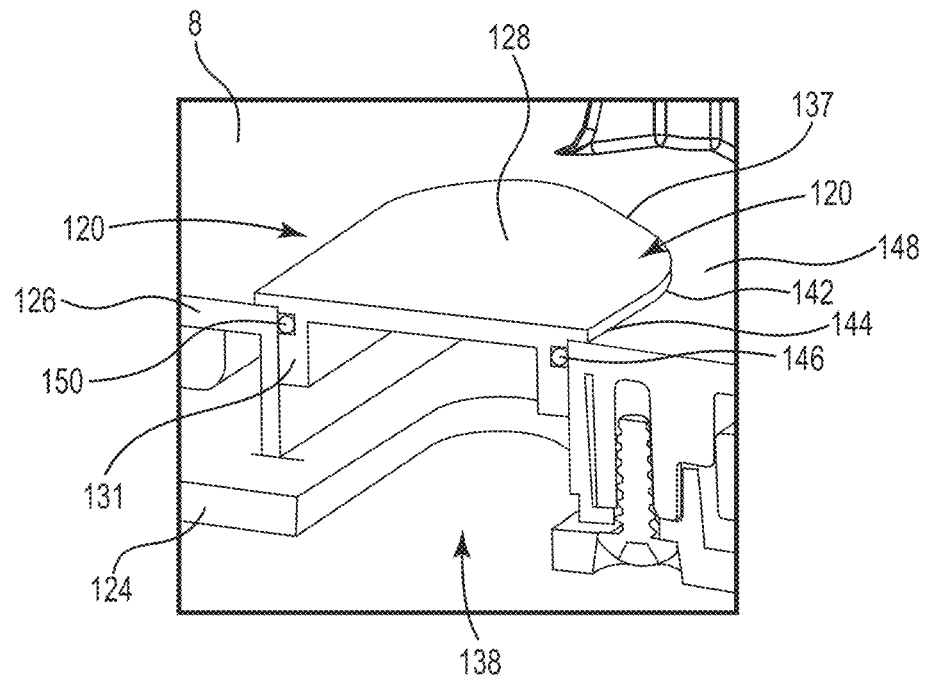
FIG. 7 is a partial cross-sectional view showing the window of FIG. 6 affixed within a door of a reticle container.

As shown in FIG. 7, window 120, having lens 128 and sidewall 130, can be retained by between door cover 124 and door housing 126 of an outer pod door such as, for example, outer pod door 8. In operation, window 120 is received in an aperture 137 of door housing 26. In some embodiments, an outer periphery 142 of lens 128 matches the size and shape of an inner periphery 144 of aperture 137. In other embodiments, an outer periphery 142 of lens 128 may be slightly greater than in inner periphery 144 of aperture 137 such that a lower surface 146 of lens 128 may contact and be supported by an upper surface 148 of door housing 126. In addition, door cover 24 has an aperture 138 that facilitates viewing through lens 128 of window 120 from a bottom of an outer pod door such as, for example, outer pod door 8.

In some embodiments, as shown in FIG. 7, a compressive seal such as, compressive seal 150, can be utilized to facilitate retention of window 120 within outer pod door 8 of the reticle container. As shown in the embodiment depicted in FIG. 5, compressive seal 150 is retained around an outer perimeter 136 of window 120 at least partially within recess 131. The compression exerted by compressive seal 150 is a sufficient force to minimize the transfer of both air or particulate matter past compressive seal 150 and into an enclosure of a reticle pod.

Compressive seal 150 can be formed from an elastomeric compound. In certain embodiments, compressive seal is formed from a fluoroelastomer. Fluoroelastomers are generally considered cleaner polymers and do not generate an abundance of particles in applications such as compression sealing. In some embodiments, compressive seal 150 can be an O-ring.

Figure 8:
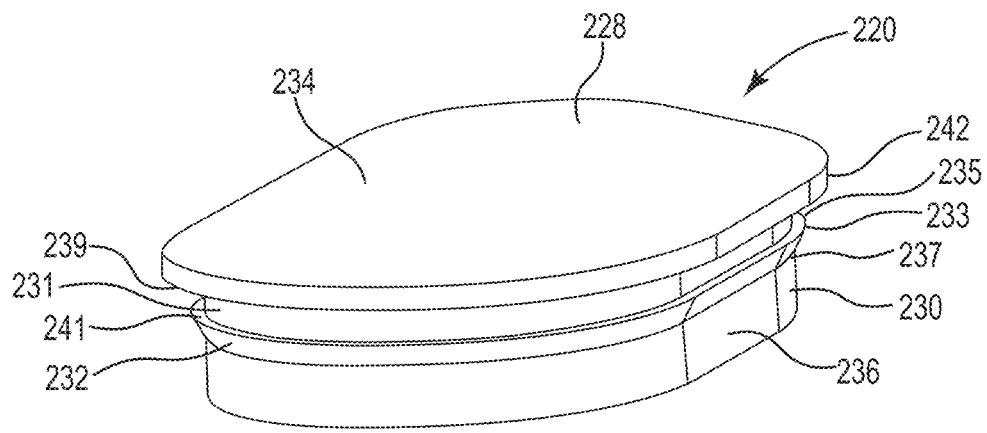
FIG. 8 illustrates another embodiment of a window for insertion into a door of a reticle container.

FIG. 8 shows an exemplary window 220 in accordance with another embodiment of this disclosure. Window 220 includes a lens 228, and sidewall 230. Sidewall 230 extends in a direction downward and away from lens 228 and circumscribes lens 228. In some embodiments, lens 228 can have a flat upper surface 234. A flared ledge 232 extends around an outer perimeter 236 of sidewall 130. Flared ledge 232 has an upper edge 233 defining a first outer perimeter 235 that is greater than a second outer perimeter 237 of flared edge 232. Upper edge 233 of flared ledge 232 extends outward and away from sidewall 230 such that a recess 231 is defined between a lower surface 239 of lens 228 and an upper surface 241 of ledge 232. Lens 228, sidewall 230 and ledge 232 can be provided as a single, integral piece.

Window 220 is constructed of a transparent material to permit the access to the indicia by the reading device. In certain embodiments, window 220 is constructed from a polycarbonate. Other clear polymers may be suitable for the fabrication of window 220. In addition, lens 228 preferably has a smooth surface to allow enough light to transmit through the lens for reading indicia. Window 220 including lens 228 can be formed by conventional melt processing techniques, such as injection molding.

Window 220 may be sufficiently sized and shaped to enable a reading device to read any indicia on a reticle (e.g., reticle 16 in FIGS. 1 and 2) contained within an inner pod such as, for example, inner pod 10 of a reticle container. For example, the reading device, through window 220 can read a two-dimensional bar code on a reticle or detect the pellicle frame on the reticle contained within the inner pod.

Figure 9:
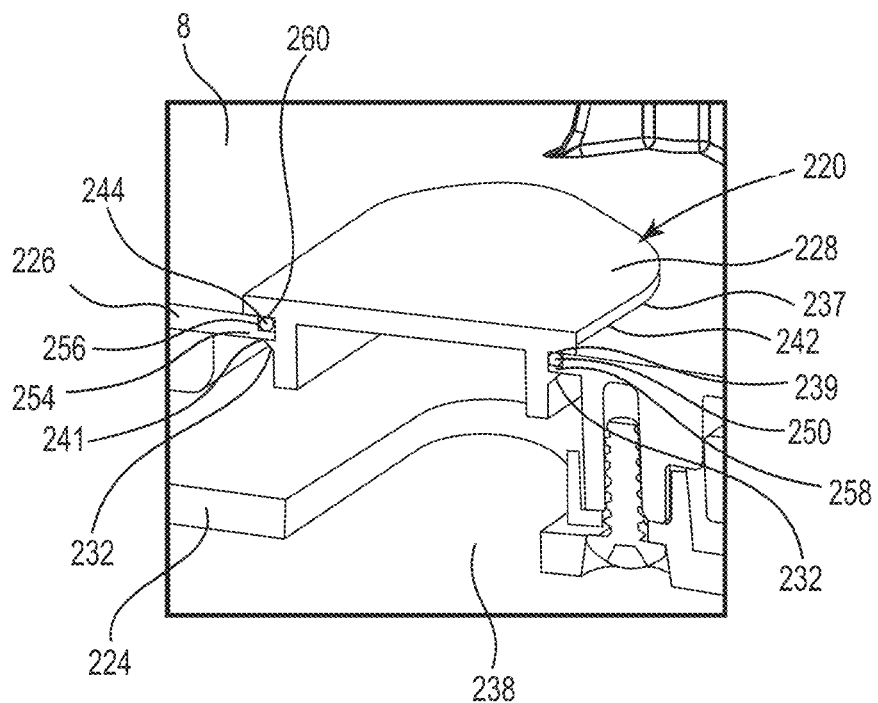
FIG. 9 is a partial cross-sectional view showing the window of FIG. 8 affixed within a door of a reticle container.

As shown in FIG. 9, window 220 can be retained by between door cover 224 and door housing 226 of an outer pod door such as, for example, outer pod door 8. In operation, window 220 is received in an aperture 237 of door housing 26. An outer periphery 242 of lens 228 matches the size and shape of an inner periphery 244 of aperture 237. In addition, door cover 224 has an aperture 238 that facilitates viewing through lens 228 of window 220 from a bottom of outer pod door.

In some embodiments, as shown in FIG. 9, door housing 226 can include a ledge 254 that extends inward from a sidewall 256 defining aperture 237. Window 220 can be received within aperture 237 such that an upper surface 241 of flared ledge 232 is in contact with and abuts against a lower surface 258 of ledge 254 mechanically locking window 220 in place within aperture 237. In addition, a compressive seal such as, compressive seal 250, can be utilized to facilitate retention of window 220 within outer pod door 8 of the reticle container.

As shown in the embodiment depicted in FIG. 9, compressive seal 250 is retained in a space defined between a bottom surface 236 of lens 228 and upper surface 260 of ledge 256. The compression exerted by compressive seal 250 is a sufficient force to minimize the transfer of both air or particulate matter past compressive seal 150 and into an enclosure of a reticle pod.

Compressive seal 250 can be formed from an elastomeric compound. In certain embodiments, compressive seal is formed from a fluoroelastomer. Fluoroelastomers are generally considered cleaner polymers and do not generate an abundance of particles in applications such as compression sealing. In some embodiments, compressive seal 250 can be an O-ring.

Door cover 224 secured to door housing 226 conventional mechanical fasteners to maintain compression on the compressive seal 250 to retain window 220 in an outer pod door such as, for example, outer pod door 8.

Figure 10:
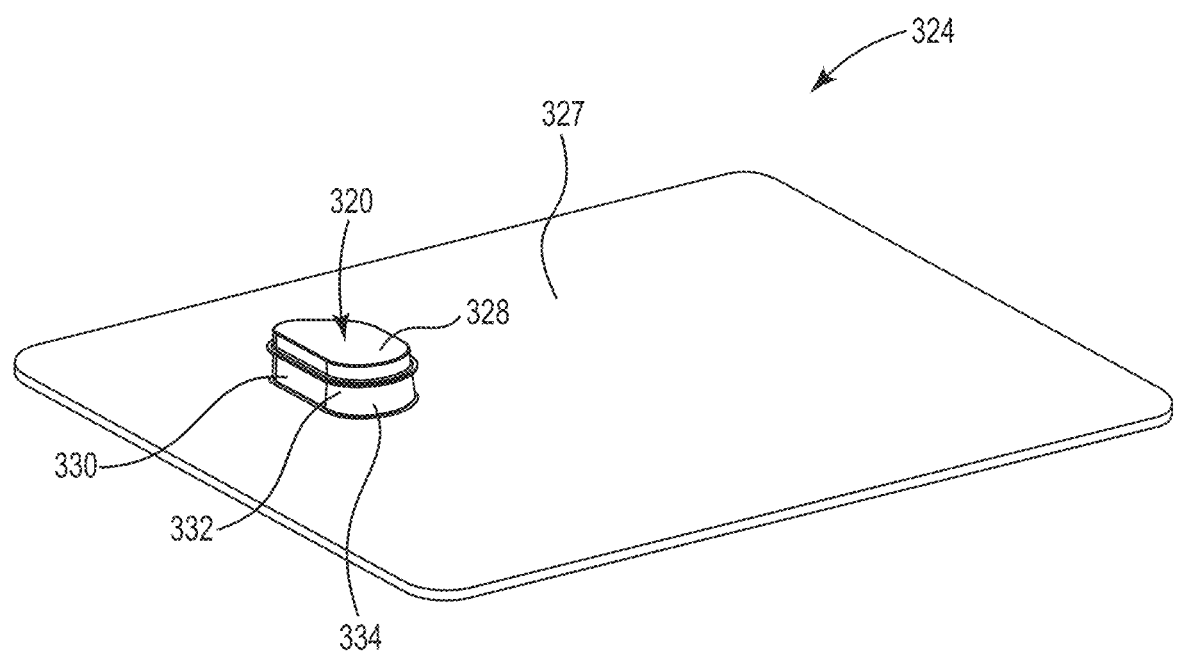
FIG. 10 is a top perspective view of a door cover including a window according to another embodiment of this disclosure.
Figure 11:
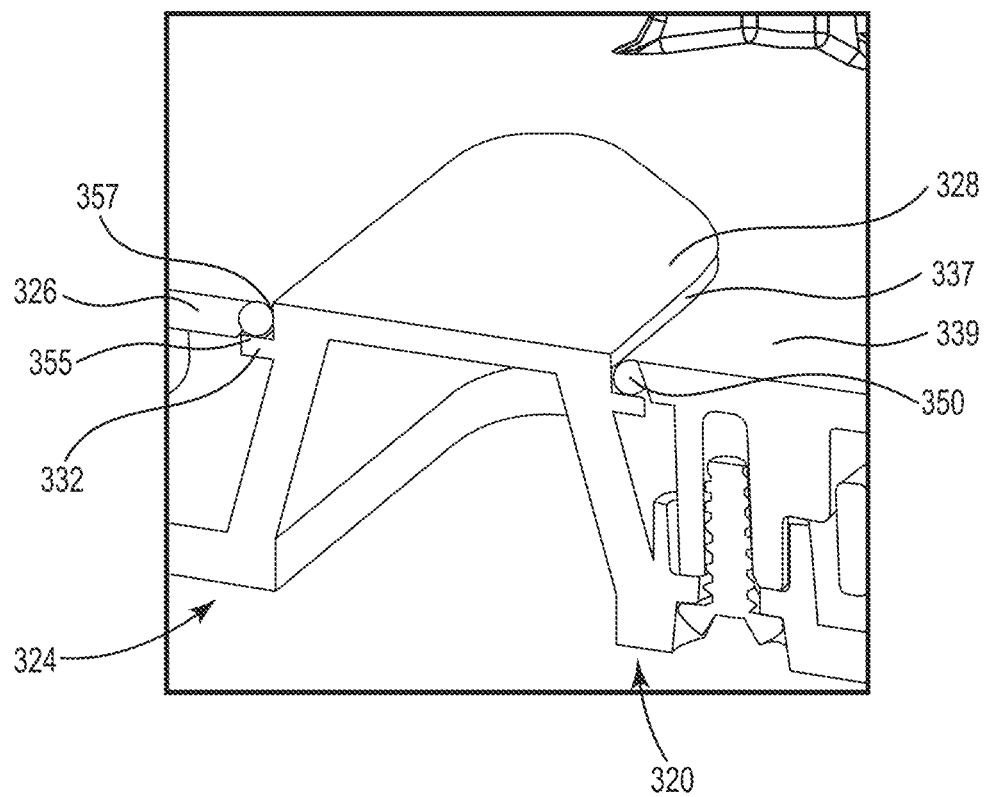
FIG. 11 is a partial cross-sectional view showing the window of FIG. 10 affixed within a door of a reticle container.

FIGS. 10-11 show different views of an embodiment in which a window, window 320 including lens 328 is formed as part of a door cover 324. In this embodiment, door cover 324 is constructed of a transparent material to permit the access to the indicia by the reading device. In certain embodiments, door cover 324 including window 320 is constructed from a polycarbonate. Other clear polymers may be suitable for the fabrication of door cover 324 and window 320. In addition, lens 328 preferably has a smooth surface to allow enough light to transmit through the lens for reading indicia. Door 324 including window 320 be formed by conventional melt processing techniques, such as injection molding.

As shown in FIGS. 10-11, window 320 includes lens 328 and sidewall 330. In some embodiments, as shown, sidewall 330 can be slanted. Sidewall 330 extends downward and away from lens 328 to upper surface 327 of door cover 324. A ledge 332 extends outward and away from sidewall 330 and extends around an outer perimeter of sidewall 330. When door cover 324 is secured to door housing 326, lens 328 is received within an aperture 337 defined in the door housing 326. An inner periphery of aperture 337 matches the size and shape of an outer periphery 339 of lens 328. A compressive seal 350 can be utilized to facilitate retention of window 320 within outer pod door of the reticle container. Compressive seal 350 can be retained between an undercut 357 defined in door housing 326 and an upper surface 355 of ledge 332. The compression exerted by compressive seal 350 is a sufficient force to minimize the transfer of both air or particulate matter past compressive seal 350 and into an enclosure of a reticle pod. Door cover 324 is secured to door housing 326 using conventional mechanical fasteners to maintain compression on the compressive seal 350 to retain window 320 in the outer pod door such as, for example, outer pod door 8.

Like the other compressive seals, disclosed herein, compressive seal 350 can be formed from an elastomeric compound. In certain embodiments, compressive seal is formed from a fluoroelastomer. Fluoroelastomers are generally considered cleaner polymers and do not generate an abundance of particles in applications such as compression sealing. In some embodiments, compressive seal 350 can be an O-ring.

Figure 12A:
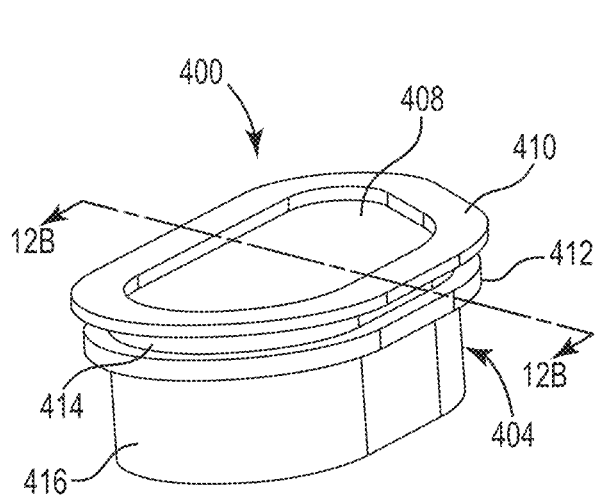
FIG. 12A is a perspective view of a window assembly provided in accordance with an embodiment of the disclosure.
Figure 12B:
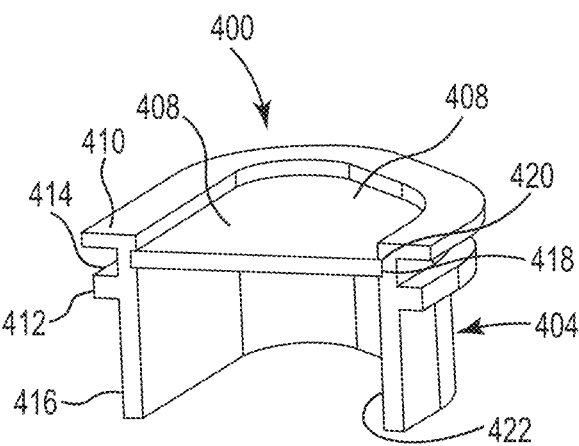
FIG. 12B is a cross-sectional view of the window assembly shown in FIG. 12A taken along line 12B-12B.

FIGS. 12A and 12B show different views of a window assembly 400 that can be received within a door, such as outer pod door 8, of a reticle container. Window assembly 400 includes grommet 404 and lens 408 retained within grommet 404. Grommet 404 includes an upper ledge 410 defining an aperture through which lens 408 can be viewed. Grommet also includes a lower ledge 412 spaced apart from upper ledge 410 such that recess 414 is defined between upper edge 410 and lower ledge 412. A sidewall 416 extends in a direction downward and away from upper ledge 410. Lower ledge 412 is integral with sidewall 416 and extends outward and away from sidewall 416. As can be seen in FIG. 12B, grommet 404 has an H-shaped cross section as defined by upper ledge 410, lower ledge 412 and sidewall 416. Additionally, as can be seen in FIG. 12B, an edge 418 of lens 408 is captured in a notch or groove 420 defined in an inner surface 422 of sidewall 416 such that the lens 408 is retained within grommet 404.

Grommet 404 can be formed from an elastomeric compound. In certain embodiments, grommet 404 is formed from a fluoroelastomer. Fluoroelastomers are generally considered cleaner polymers and do not generate an abundance of particles in applications such as compression sealing. The pliability of the elastomer or fluoroelastomer from which grommet 404 can be fabricated facilitates creation of a seal against the window and also an inner surface of the door housing.

Lens 408 is constructed of a transparent material. In certain embodiments, lens 408 is constructed from a polycarbonate. Other clear polymers may be suitable for the fabrication of lens 408. In other embodiments, lens 408 is constructed from glass. In addition, lens 408 preferably has a smooth surface to allow enough light to transmit through the lens for reading indicia and/or viewing a reticle or pellicle contained within an inner pod.

Lens 408 may be sufficiently sized and shaped to enable a reading device to view and/or read any indicia on a reticle (e.g., reticle 16 in FIGS. 1 and 2) contained within an inner pod such as, for example, inner pod 10 of a reticle container. For example, the reading device, through window 408 can read a two-dimensional bar code on a reticle or detect the pellicle frame on the reticle contained within the inner pod.

Figure 13:
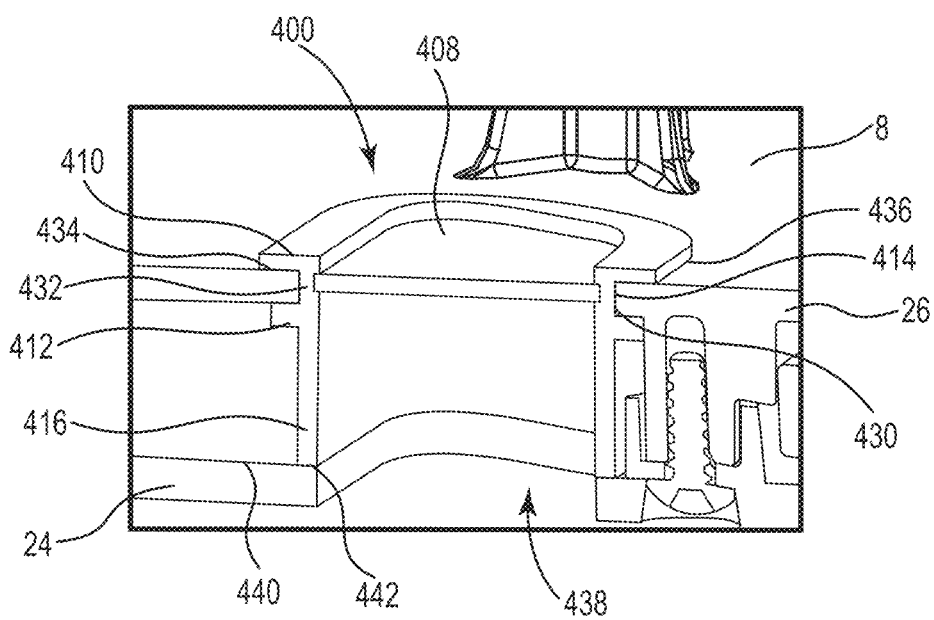
FIG. 13 is a partial cross-sectional view showing the window of FIGS. 12A and 12B contained within a door of a reticle container.

As shown in FIG. 13, window assembly 400 can be retained by between door cover 24 and door housing 26 of an outer pod door such as, for example, outer pod door 8. In operation, window 400 is received in an aperture 430 of door housing 26 such that an inner edge 432 of door housing 436 defining aperture 430 is captured in recess 414 defined between upper ledge 410 and lower ledge 412. A lower surface 434 of upper edge 410 can contact and rest on an upper surface 436 of door housing 26. In addition, door cover 24 has an aperture 438 that facilitates viewing through lens 408 of window 400 from a bottom of outer pod door. In some embodiment, sidewall 416 may extend downward such that a lower edge 442 of side wall contacts an upper surface 440 of door cover 24. In other embodiments (not shown), sidewall 416 extends downward such that a lower edge 442 of sidewall 416 is between door housing 26 and door cover 24.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in the details, particularly in matters of shape, size, and arrangement of parts without exceeding the scope of the disclosure. The disclosure's scope is, of course, defined in the language in which the appended claims are expressed

What is claimed is:

1. A reticle pod door comprising:
a door housing;
a door cover secured to the door housing;
an aperture defined in the door housing;
a window including a lens, a sidewall and a ledge, wherein the window is contained within the reticle pod door between the door housing and the door cover such that the lens is viewable through the aperture defined in the door housing and the lens extends for a length of the aperture and a width of the aperture; and
a compressive seal contacting the ledge of the window.

2. The reticle pod door of claim 1, wherein the door cover includes an additional aperture such that the lens is viewable from a bottom of the reticle pod door.

3. The reticle pod door of claim 1, wherein the sidewall extends downward and away from the lens and circumscribes the lens defining an outer perimeter of the window.

4. The reticle pod door of claim 3, wherein the sidewall extends downward and away from the lens such that a lower edge of the sidewall contacts an upper surface of the door cover.

5. The reticle pod door of claim 3, wherein the sidewall extends downward and away from the lens such that a lower edge of the sidewall is between a lower surface of the door housing an upper surface of the door cover.

6. The reticle pod door of claim 1, wherein the ledge ends outward and away from the sidewall around an outer perimeter of the window.

7. The reticle pod door of claim 1, wherein the ledge is defined by a recess formed in the sidewall.

8. The reticle pod door of claim 1, wherein the ledge extends outward and away from the sidewall around an outer perimeter of the window and has a first outer perimeter greater than a second outer perimeter.

9. The reticle pod door of claim 8, wherein a recess is defined between a lower surface of the lens and an upper surface of the ledge.

10. The reticle pod door of claim 1, wherein the window, lens, and ledge are integrally formed in the door cover such that when the door cover is secured to the door housing the lens is received within the aperture of the door housing.

11. The reticle pod door of claim 1, wherein the lens, sidewall, and ledge are provided as a single integral piece.

12. A reticle container comprising:
 a pod cover;
 a pod door, wherein the pod door includes a door housing, a door cover secured to the door housing, an aperture defined in the door housing, and a window including a lens, a sidewall and a ledge, wherein the window is retained in the pod door such that the lens is viewable through the aperture defined in the door housing and the lens fills the aperture; and
 a compressive seal contacting the ledge of the window.

13. The reticle container of claim 12, an outer pod cover and outer pod door defining an outer pod and wherein the reticle pod container further comprises an inner pod contained within the outer pod, the inner pod including the pod housing and the pod door including the window, wherein when the inner pod is contained within the outer pod, the window on the pod door of the inner pod is aligned with the window in the pod door of the outer pod.

14. The reticle container of claim 12, wherein the sidewall of the window extends downward and away from the lens such that a lower edge of the sidewall contacts an upper surface of the door cover of the pod door.

15. The reticle container of claim 12, wherein the sidewall of the window extends downward and away from the lens such that a lower edge of the sidewall is between a lower surface of the door housing an upper surface of the door cover.

* * * * *